(12) United States Patent
Ishii et al.

(10) Patent No.: US 6,903,030 B2
(45) Date of Patent: Jun. 7, 2005

(54) SYSTEM AND METHOD FOR HEAT TREATING SEMICONDUCTOR

(75) Inventors: Katsutoshi Ishii, Tsukui-gun (JP); Yutaka Takahashi, Esashi (JP); Harunari Hasegawa, Tsukui-gun (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/477,110

(22) PCT Filed: Mar. 13, 2002

(86) PCT No.: PCT/JP02/02327
§ 371 (c)(1),
(2), (4) Date: Nov. 10, 2003

(87) PCT Pub. No.: WO02/091447
PCT Pub. Date: Nov. 14, 2002

(65) Prior Publication Data
US 2004/0168638 A1 Sep. 2, 2004

(30) Foreign Application Priority Data
May 9, 2001 (JP) ..................... 2001-138831

(51) Int. Cl.[7] ................. H01L 21/31; H01L 21/469
(52) U.S. Cl. ............. 438/782; 438/769; 438/783; 438/909; 118/719; 118/715; 118/724
(58) Field of Search ............... 438/782, 769, 438/770, 773, 783, 792, 788, 909; 118/719, 715, 724

(56) References Cited

U.S. PATENT DOCUMENTS

| 5,388,944 A | 2/1995 | Takanabe et al. |
| 5,484,746 A | 1/1996 | Ichikawa et al. |
| 6,270,581 B1 * | 8/2001 | Inokuchi et al. ............ 118/696 |
| 6,297,172 B1 * | 10/2001 | Kashiwagi .................. 438/773 |
| 2002/0173032 A1 * | 11/2002 | Zou et al. ................ 435/287.2 |
| 2002/0182888 A1 * | 12/2002 | Buchanan et al. .......... 438/769 |

FOREIGN PATENT DOCUMENTS

| EP | 0808915 | 11/1997 |
| JP | 11-260728 | 9/1999 |
| KR | 2000006527 | 1/2000 |

* cited by examiner

Primary Examiner—Caridad M. Everhart
(74) Attorney, Agent, or Firm—Oblon, Spivak, McClelland, Maier & Neustadt, P.C.

(57) ABSTRACT

A supply system in a heat-treating apparatus for a semiconductor process has a combustor (12), heating unit (13), and gas distributor (14). The combustor (12) has a combustion chamber (59) disposed outside a process chamber (21). The combustor (12) generates water vapor by reaction of hydrogen gas and oxygen gas in the combustion chamber (59), and supplies it to the process chamber (21). The heating unit (13) has a heating chamber (61) disposed outside the process chamber (21). The heating unit (13) selectively heats a gas not passing through the combustion chamber (59) to a temperature not lower than an activating temperature of the gas, and supplies it to the process chamber (21). The gas distributor (14) selectively supplies the hydrogen gas and oxygen gas to the combustion chamber (59), and selectively supplies a reactive gas and inactive gas to the heating chamber (61).

32 Claims, 9 Drawing Sheets

SYSTEM AND METHOD FOR HEAT TREATING SEMICONDUCTOR

TECHNICAL FIELD

The present invention relates to a heat-treating apparatus and method for a semiconductor process which heat-treat a target substrate such as a semiconductor wafer. The semiconductor process refers to various types of processes performed to form a semiconductor layer, insulating layer, conductive layer, and the like on a target substrate such as a semiconductor wafer or LCD substrate with a predetermined pattern. This aims at manufacturing a semiconductor device or a structure including an interconnection, electrode, and the like to be connected to the semiconductor device on the target substrate.

BACKGROUND ART

In the semiconductor process, a vertical heat-treating apparatus is known as a batch type processing apparatus. The batch type processing apparatus heat-treats a large number of semiconductor wafers at once by, e.g., oxidation, diffusion, annealing, and CVD. In the vertical heat-treating apparatus, a large number of wafers are arrayed and held at predetermined gaps in the vertical direction in a holding tool called a wafer boat. This holding tool is loaded into a vertical process chamber. The wafers are heat-treated while being heated by a heating mechanism disposed around the process chamber.

As a process which forms a silicon oxide film ($SiO_2$ film) by oxidizing a silicon wafer, a dry oxidation process and wet oxidation process are known. In the dry oxidation process, oxygen ($O_2$) gas and hydrogen chloride (HCl) gas are supplied to the process chamber. In the wet oxidation process, water vapor and oxygen gas are supplied to the process chamber. The dry oxidation process and wet oxidation process are selected in accordance with the target film quality.

In the dry oxidation process, a silicon wafer and layer are oxidized by the oxygen gas, while surface impurities are removed by the gettering effect of chloride. More specifically, for example, a large number of wafers are held like shelves by a wafer boat, and are loaded in a vertical process chamber. A processing atmosphere with a predetermined temperature is formed in the process chamber. Subsequently, oxygen gas and hydrogen chloride gas are supplied at room temperature into the process chamber from its ceiling, and are exhausted from the lower side.

The wet oxidation process requires an external combustor outside the process chamber. Part of the oxygen gas and the hydrogen ($H_2$) gas are burned by the combustor to generate water vapor. The remaining oxygen and water vapor are supplied into the process chamber.

As another heat treatment, an oxinitriding process is known. According to the oxinitriding process, dinitrogen monoxide gas ($N_2O$ gas) is introduced at room temperature into the process chamber. The introduced gas reacts with the silicon layer of the wafer to form a silicon oxide film (silicon oxinitride film) containing nitrogen.

DISCLOSURE OF INVENTION

It is an object of the present invention to provide a heat-treating apparatus and method for a semiconductor process, with which when a target substrate is to be heat-treated by an oxidation process or the like, the process temperature can be decreased.

According to a first aspect of the invention, there is provided a heat-treating apparatus for a semiconductor process, comprising:

a process chamber which accommodates a target substrate;

a support member which is disposed in the process chamber and supports the target substrate;

a heater which heats the target substrate accommodated in the process chamber;

an exhaust system to evacuate an interior of the process chamber; and a supply system to supply a process gas into the process chamber, wherein the supply system comprises a combustor which is disposed outside the process chamber and has a combustion chamber, the combustor serving to generate water vapor by reaction of hydrogen gas and oxygen gas in the combustion chamber and supply the water vapor to the process chamber, a heating unit which is disposed outside the process chamber and has a heating chamber, the heating unit serving to selectively heat a gas not passing through the combustion chamber to a temperature not lower than an activating temperature of the gas and supply the gas to the process chamber, and a gas distributor which selectively supplies hydrogen gas and oxygen gas to the combustion chamber and selectively supplies a reactive gas and inactive gas to the heating chamber.

According to a second aspect of the invention, there is provided a heat-treating apparatus for a semiconductor process, comprising:

a process chamber which accommodates a target substrate;

a support member which is disposed in the process chamber and supports the target substrate;

a heater which heats the target substrate accommodated in the process chamber;

an exhaust system to evacuate an interior of the process chamber; and a supply system to supply a process gas into the process chamber, wherein the supply system comprises a combustor which is disposed outside the process chamber and has a combustion chamber, the combustor serving to generate water vapor by reaction of hydrogen gas and oxygen gas in the combustion chamber and supply the water vapor to the process chamber, a heating unit which is disposed outside the process chamber and has a heating chamber, the heating unit serving to selectively heat in the heating chamber a gas not passing through the combustion chamber and supply the gas to the process chamber, a gas distributor which selectively supplies hydrogen gas and oxygen gas to the combustion chamber and selectively supplies an oxidizing gas, an oxinitriding gas, a compound gas containing hydrogen and chloride, and an inactive gas to the heating chamber, and a controller which controls the combustor, the heating unit, and the gas distributor so as to use the combustor and the heating unit selectively.

According to a third aspect of the invention, there is provided a heat-treating method for a semiconductor process, comprising the steps of:

accommodating a target substrate in a process chamber;

heating the target substrate accommodated in the process chamber, performing a wet oxidation process of oxidizing the target substrate to form an oxide film by supplying water vapor to the process chamber while making hydrogen gas react with oxygen gas to generate the water vapor by a combustor which is disposed outside the process chamber and has a combustion chamber, and subjecting the target substrate to a first process other than a wet oxidation process by supplying a reactive gas to the process chamber while heating the reactive gas to a temperature not less than an activating temperature of the reactive gas by a heating unit which is disposed outside the process chamber and has a heating chamber.

BEST MODE FOR CARRYING OUT THE INVENTION

The present inventors studied problems of a dry oxidation process, wet oxidation process, oxinitriding process, and the like of a vertical heat-treating apparatus in development of the present invention. The present inventors eventually obtained the following findings.

In the heat treatment of a semiconductor wafer, the higher the process temperature, the more likely a defect called slip tends to occur in the wafer, and the larger the thermal influence on a film on the wafer. Hence, to decrease the process temperature is currently under study. When, however, the process temperature is decreased, the process uniformity (planar uniformity) on one target substrate (e.g., between the center and periphery of the wafer) decreases. The decrease in planar uniformity becomes prominent as the diameter of the wafer increases. When the process temperature is decreased, the process uniformity (inter-planar uniformity) among a plurality of target substrates (e.g., between upper and lower wafers in the batch process) also decreases.

It is assumed that, in the vertical heat-treating apparatus, oxygen gas and hydrogen chloride gas are supplied to the wafers on the wafer boat from the upper side of a reaction tube (process chamber), thus performing a dry oxidation process. In this case, the higher the position of the wafer on the wafer boat, the worse the planar uniformity of the thickness of the silicon oxide film. The reason for this may be as follows.

Figure 10A:
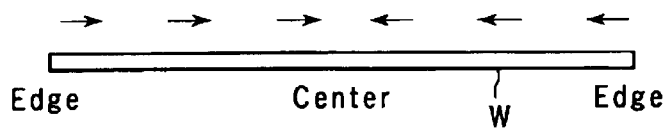
FIGS. 10A to 10C are graphs for explaining problems of a conventional dry oxidation process.
Figure 10B:
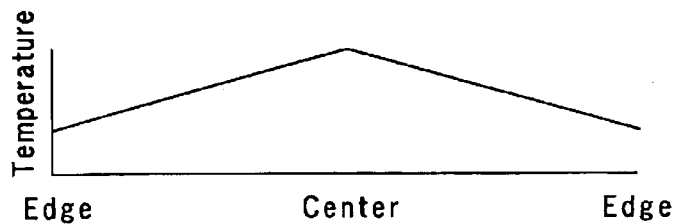
Figure 10C:
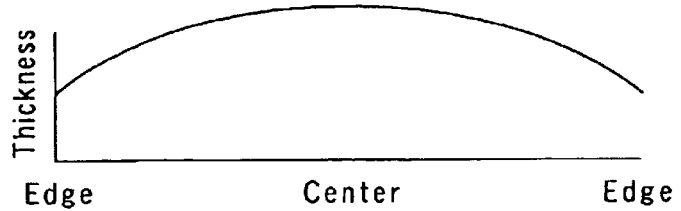

FIGS. 10A to 10C are graphs for explaining problems of a conventional dry oxidation process. FIGS. 10A, 10B, and 10C schematically show a gas flow on a wafer W, the temperature of the wafer W, and the film thickness of the wafer W, respectively. Oxygen gas and hydrogen chloride gas flow from the periphery to the center of the wafer W (see FIG. 10A), and silicon on the wafer W is oxidized by the oxygen gas. As heat of the wafer W is dissipated from the periphery, the wafer temperature increases toward the center (see FIG. 10B) of the wafer. The oxidation reaction is thus promoted more at the center of the wafer W. Hence, the silicon oxide film tends to be thicker at the center than at the periphery (see FIG. 10C).

Hydrogen is generated by decomposition of hydrogen chloride. Oxygen reacts with this hydrogen to generate water vapor, although in a small amount. On the upper side of the wafer boat, the gases are not sufficiently heated. As the gases are heated from the periphery toward the center of the wafer W, the generation amount of water vapor increases. The water vapor has an effect of growing the oxide film. A difference in generation amount of water vapor largely influences the film thickness. As a result, in a wafer W on the upper side, the film thickness is larger at the center, resulting in a so-called hill-like film thickness distribution (poor planar uniformity).

The process gases are heated more as they flow toward the lower side of the reaction tube. On the lower side of the wafer boat, the water vapor generating reaction reaches a substantial equilibrium state. More specifically, before the gases flow along the wafer W, they have already generated water vapor almost completely. In a wafer W on the lower side, when the process gases flow from the periphery toward the center of the wafer W, a difference in water vapor generation amount depending on the position of the wafer W is small. Hence, a difference in thickness caused by a difference in water vapor generation amount is also small. Therefore, the lower the position of the wafer, the better the planar uniformity of the thickness of the silicon oxide film on the wafer W.

In the oxinitriding process of forming a nitrogen-containing silicon oxide film (silicon oxinitride film) by using dinitrogen monoxide gas, when the process temperature is decreased, the same tendency is observed. In this case, when the dinitrogen monoxide gas decomposes, oxygen and silicon react to form a silicon oxide film. Simultaneously, the active species of nitrogen generated by decomposition enter the silicon oxide film. Thus, the silicon oxinitride film grows.

In this process as well, the temperature of the wafer W is higher toward the center of the wafer W, as described above. If the process temperature is low, the dinitrogen monoxide gas is not sufficiently decomposed at the upper side of the wafer boat. Hence, in the wafer W on the upper side, as the dinitrogen monoxide gas flows toward the center, its decomposition is promoted. As a result, in the wafer W on the lower side, the film thickness is larger at the center, resulting in a so-called hill-like thickness distribution (poor planar uniformity).

The dinitrogen monoxide gas is heated more as it flows toward the lower side of the reaction tube. Hence, on the lower side of the wafer boat, gas decomposition progresses sufficiently, or better, even if not sufficient, than on the upper side. Accordingly, in the wafer W on the lower side, when the dinitrogen monoxide gas flows from the periphery toward the center of the wafer W, a difference in gas decomposition depending on the position of the wafer W is small. Accordingly, a difference in film thickness caused by the difference in gas decomposition is also small. Therefore, the lower the position of the wafer, the better the planar uniformity of the thickness of the silicon oxinitride film on the wafer W.

In this manner, when the process temperature is decreased, the planar uniformity of the process for the wafer on the upper side degrades, and the inter-planar uniformity also degrades. Hence, the process temperature is currently difficult to decrease.

An embodiment of the present invention constructed on the basis of the above findings will be described with reference to the accompanying drawing. In the following description, constituent elements having substantially the same functions and arrangements are denoted by the same reference numerals, and a repetitive description will be made only if necessary.

Figure 1:
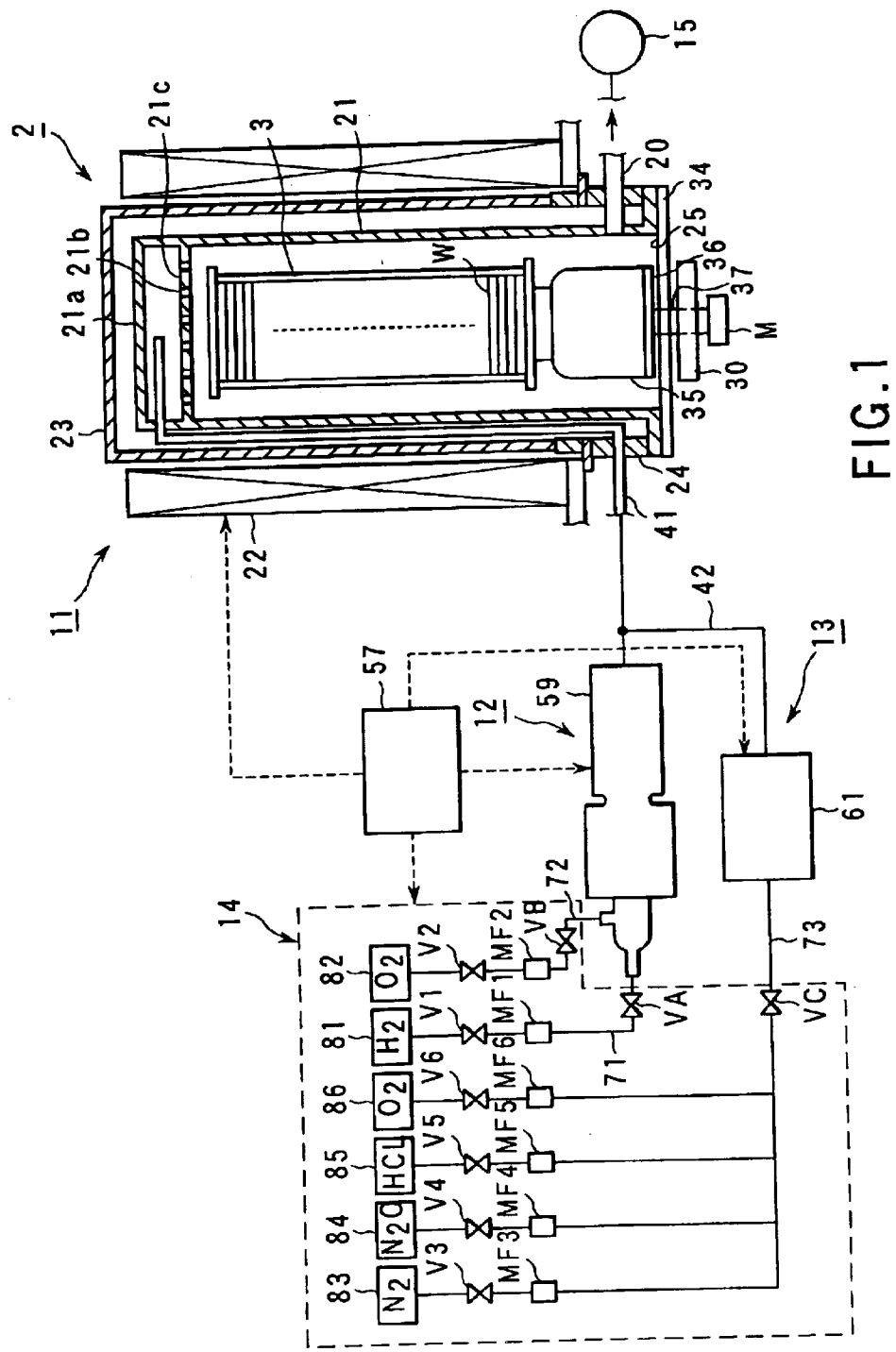
FIG. 1 is a vertically sectional side view showing a vertical heat-treating apparatus according to an embodiment of the present invention.

FIG. 1 is a vertically sectional side view showing a vertical heat-treating apparatus according to an embodiment of the present invention. This heat-treating apparatus has a vertical heat-treating unit 11, combustor 12, heating unit 13, and gas distributor 14 which are controlled by a main controller 57. This heat-treating apparatus can perform a wet oxidation process, dry oxidation process, and oxinitriding process selectively. In the wet oxidation process, hydrogen gas and oxygen gas are burned by the combustor 12 to generate water vapor. A wafer is oxidized by using the water vapor. In the dry oxidation process, oxygen gas (oxidizing gas) and hydrogen chloride gas (a compound gas containing hydrogen and chloride; gettering gas) are heated by the heating unit 13. The wafer is oxidized by using these gases. In the oxinitriding process,.dinitrogen monoxide gas (oxinitriding gas) is heated by the heating unit 13. The wafer is oxinitrided by using this gas.

Figure 2:
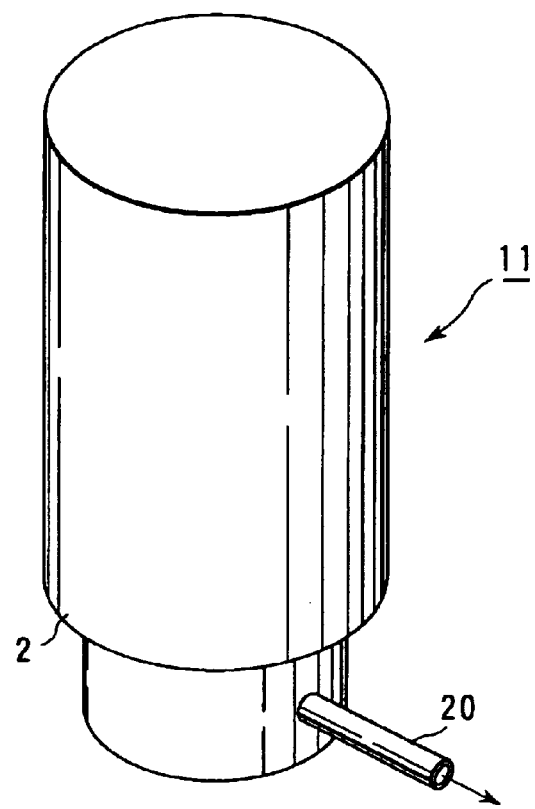
FIG. 2 is an exploded perspective view showing a process unit used in the heat-treating apparatus shown in FIG. 1.
Figure 2:
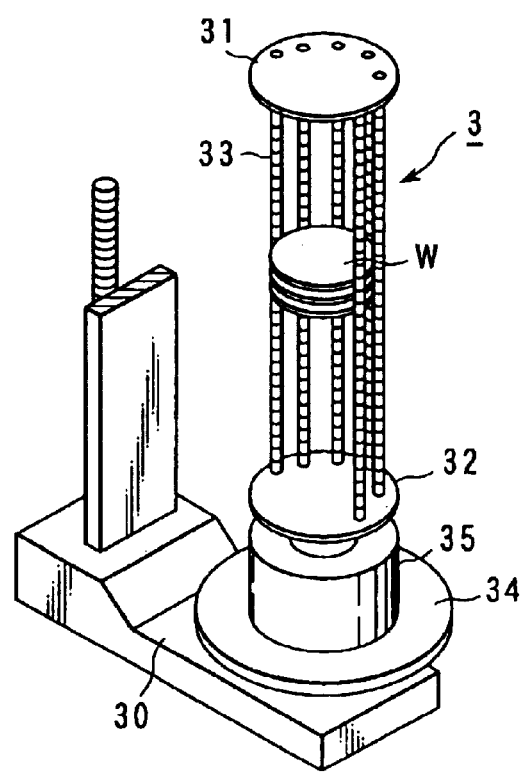

FIG. 2 is an exploded perspective view showing the heat-treating unit 11 used in the heat-treating apparatus shown in FIG. 1. As shown in FIGS. 1 and 2, the heat-treating unit 11 has a vertical heat-treating furnace 2. The heat-treating furnace 2 is connected to the gas distributor 14 through a first gas supply pipe 41, and to an exhaust means 15 through an exhaust pipe 20. A wafer boat 3 as a support tool or holding tool for wafers W is detachably arranged in the heat-treating furnace 2. The wafer boat 3 is vertically moved by a wafer boat elevator 30 disposed at the lower portion of the heat-treating furnace 2.

The vertical heat-treating furnace 2 includes a vertical reaction tube (process chamber) 21 made of, e.g., quartz, and having an open lower end. A heater 22 serving as a heating means formed of, e.g., a heating resistor, is disposed to surround the reaction tube 21. A thermally uniformizing tube 23 is disposed between the reaction tube 21 and heater 22. The thermally uniformizing tube 23 is supported at its lower end by an insulator 24.

A gas diffusion plate 21c having a large number of gas holes 21b is disposed in the reaction tube 21 slightly below an upper wall 21a. The first gas supply pipe 41 extends through the insulator 24 from the outside and is bent inside the insulator 24 into an L shape. The first gas supply pipe 41 then stands vertically upright between the reaction tube 21 and thermally uniformizing tube 23. The distal end of the first gas supply pipe 41 projects into a space between the upper wall 21a and gas diffusion plate 21c of the reaction tube 21.

As shown in FIG. 2, the wafer boat 3 has, e.g., a top plate 31, a bottom plate 32, and a plurality of columns 33. The columns 33 connect the top plate 31 and bottom-plate 32. A plurality of grooves are formed in the columns 33 at gaps in the vertical direction. The edges of the wafers W are inserted in these grooves, so the wafers W are held horizontally. The wafer boat 3 is placed on a lid 34 through, e.g., a heat insulating cylinder 35 serving as a heat insulating member. The lid 34 opens/closes an opening 25 at the lower end of the reaction tube 21. The heat insulating cylinder 35 is placed on a turntable 36, and is rotated by a driving section M through a rotating shaft 37. The driving section M is provided to the elevator 30. The lid 34 is attached to the elevator 30. When the elevator 30 is moved vertically, the wafer boat 3 is loaded in or unloaded from the heat-treating furnace 2.

Figure 3:
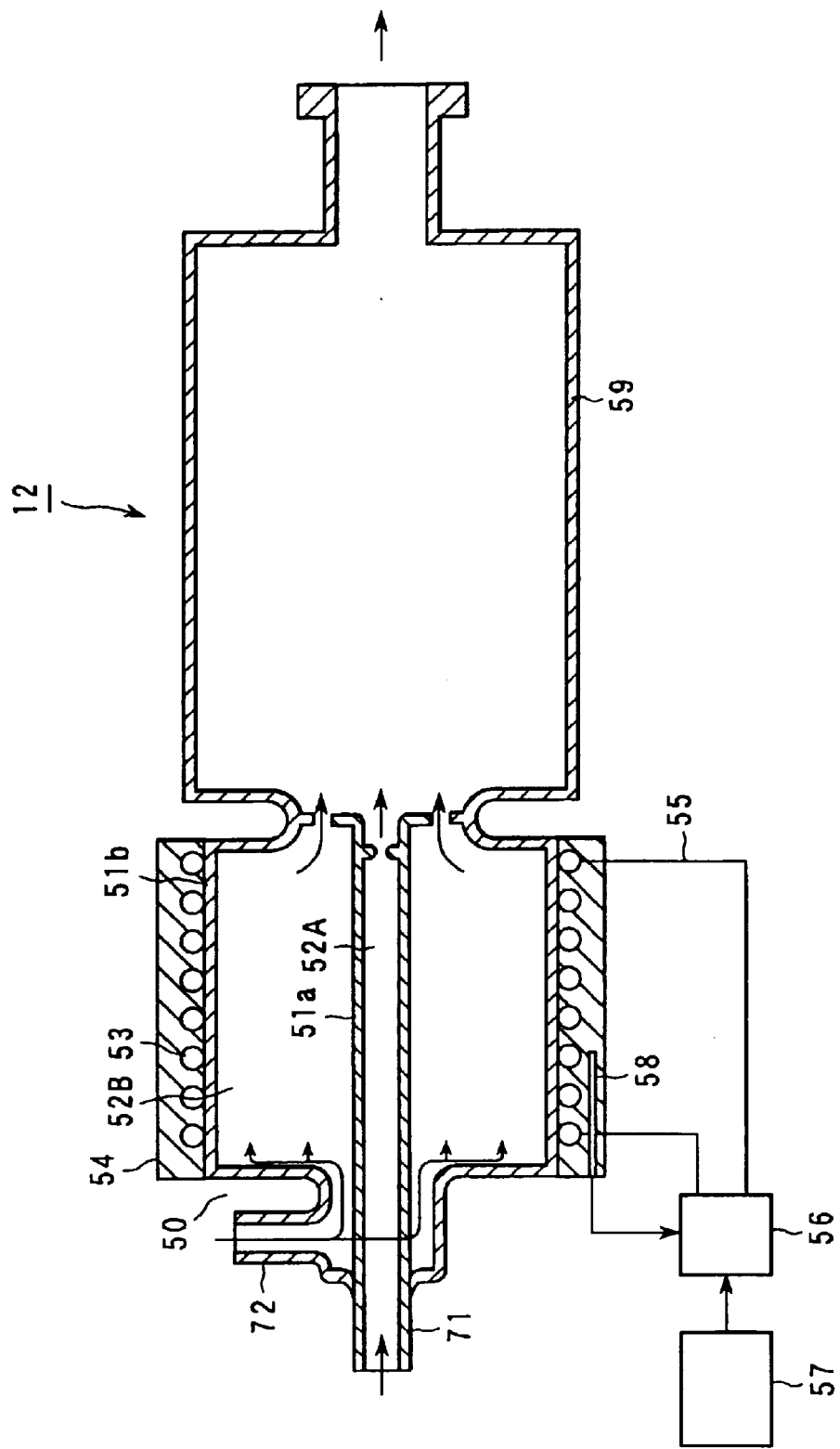
FIG. 3 is a sectional view showing a combustor used in the heat-treating apparatus shown in FIG. 1.

FIG. 3 is a sectional view showing the combustor 12 used in the heat-treating apparatus shown in FIG. 1. As shown in FIG. 1, the combustor 12 is connected, outside the vertical heat-treating unit 11, to the upstream side of the first gas supply pipe 41 made of, e.g., quartz. As shown in FIG. 3, the combustor 12 has a concentric double-structure portion 50 formed of an inner pipe 51a and outer pipe 51b made of, e.g., transparent quartz. An inner heating space 52A is formed inside the inner pipe 51a. An outer heating space 52B is formed between the inner and outer pipes 51a and 51b.

The inner heating space 52A communicates with a first gas inlet pipe 71 as it extends forward. The outer heating space 52B is constricted on its upstream side, and communicates with a second gas inlet pipe 72. The second gas inlet pipe 72 extends at the right angle from the constricted portion. A gas flow channel extends from the first gas inlet pipe 71 to the reaction tube 21 through the inner heating space 52A and first gas supply pipe 41. Another gas flow channel extends from the second gas inlet pipe 72 to the reaction tube 21 through the outer heating space 52B and first gas supply pipe 41. These gas flow channels correspond to the first gas flow channel.

For example, a helical carbon wire heater 53 is disposed on the outer surface of the outer heating space 52B, and is covered by a cylindrical insulator 54. For example, the heater 53 has a string-like body and a helical quartz pipe. The string-like body is formed by knitting together a plurality of bundles of carbon fibers containing a small amount of metal impurities. The quartz pipe accommodates and seals the string-like body. The heater 53 generates heat upon reception of a voltage through a power supply line 55 connected to a power controller 56. A main controller 57 for controlling this heat-treating apparatus outputs a signal corresponding to a preset heating temperature that it designates. A temperature sensor 58 in the vicinity of the heater 53 and formed of, e.g., a thermocouple outputs a temperature detection signals. The power controller 56 controls a power supply amount to the heater 53 on the basis of these signals.

The inner and outer heating spaces 52A and 52B communicate with a downstream combustion chamber 59. When wet oxidation is to be performed by using hydrogen gas and oxygen gas as the process gases, the hydrogen gas and oxygen gas cause combustion reaction in the combustion chamber 59 to generate water vapor.

Figure 4:
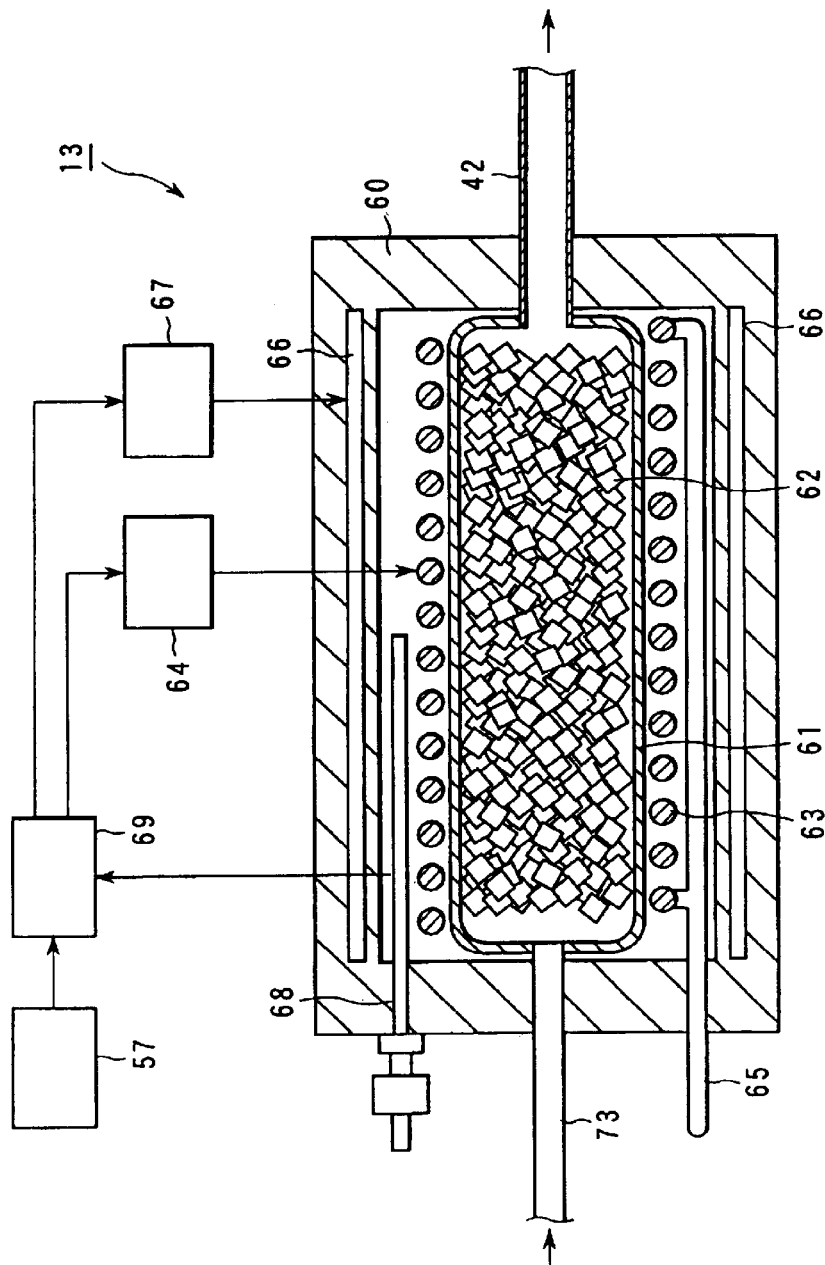
FIG. 4 is a sectional view showing a heating unit used in the heat-treating apparatus shown in FIG. 1.

FIG. 4 is a sectional view showing the heating unit 13 used in the heat-treating apparatus shown in FIG. 1. As shown in FIG. 1, the heating unit 13 is connected to the upstream side of a second gas supply pipe 42 made of, e.g., quartz. The second gas supply pipe 42 branches from the first gas supply pipe 41 between the vertical heat-treating unit 11 and combustor 12. The heating unit 13 has a heating chamber 61 connected to the second gas supply pipe 42 and made of, e.g., transparent quartz. As shown in FIG. 4, the heating chamber 61 is formed of a cylindrical heating pipe. This heating pipe has an inner diameter larger than that of a third gas supply pipe 73 and is elongated in the gas passing direction. The third gas supply pipe 73 introduces the process gases. A gas flow channel extends from the third gas supply pipe 73 to the reaction tube 21 through the heating chamber 61 and second gas supply pipe 42. This gas flow channel corresponds to the second gas flow channel.

A breathing resistance member 62 is disposed in the heating chamber 61. When heated, the breathing resistance member 62 serves as a heating medium. The breathing resistance member 62 also applies a breathing resistance to the gasses passing through it. The breathing resistance member 62 is formed of an aggregate of a large number of pieces made of quartz, a ceramic material, or the like. In this embodiment, the breathing resistance member 62 is formed by fusing a large number of quartz pieces (e.g., beads). For example, when the second gas supply pipe 42 has an inner diameter of 20 mm, the heating chamber 61 has an inner diameter of, e.g., 60 mm to 80 mm and a length of, e.g., about 100 mm to 200 mm in the breathing direction. Each quartz bead to be filled in the heating chamber 61 has a diameter of, e.g., about $\phi 1$ to $\phi 10$.

A carbon wire heater 63 which forms a heating means is helically wound around the outer surface of the heating chamber 61. For example, the heater 63 has a string-like body and a helical quartz pipe. The string-like body is formed by knitting together a plurality of bundles of carbon fibers containing a small amount of metal impurities. The quartz pipe accommodates and seals the string-like body. In FIG. 4, reference numerals 64 and 65 denote a power supply unit and a terminal, respectively, to the heater 63.

The heating chamber 61 and heater 63 are covered by a cylindrical casing 60. The casing 60 is made of, e.g., a sintered insulator of high-purity silicon oxide ($SiO_2$). A cooling jacket 66 is formed in the casing 60. A coolant, e.g., cooling water, flows through the cooling jacket 66 along the heater 63 (in the breathing direction). Cooling water is supplied to the cooling jacket 66 from a cooling water supply unit 67. A temperature detector 68, e.g., a thermocouple, is disposed between the cooling jacket 66 and heater 63 in the casing 60. The temperature detector 68 detects the temperature in the casing 60. On the basis of this temperature, the main controller 57 outputs a control signal to the power supply unit 64 and cooling water supply unit 67 through a supply amount controller 69. Thus, the power supply amount to the heater 63 and the cooling water supply amount to the cooling jacket 66 are controlled. That is, the heating chamber 61 is adjusted to a predetermined temperature by the mutual operation of heating by the heater 63 and cooling by the cooling jacket 66.

The heating chamber 61 of the heating unit 13 and the breathing resistance member 62 filled in it form a heat exchanger for gases passing through them. More specifically, the process gases are introduced through the third gas supply pipe 73 into the heating chamber 61 adjusted to the predetermined temperature. The process gases and the heated breathing resistance member 62 come into contact with each other. Therefore, the process gases can be preheated to a predetermined high temperature of 300° C. to 1,100° C., typically 800° C. to 1,000° C.

As shown in FIG. 1, the gas distributor 14 is disposed upstream of the combustor 12 and heating unit 13. More specifically, opening/closing valves VA, VB, and VC are connected to the first, second, and third gas inlet pipes 71, 72, and 73, respectively. The first gas inlet pipe 71 is connected to a hydrogen gas source 81. A valve V1 and a mass flow controller MF1 as a flow controller are connected midway along the first gas inlet pipe 71. The second gas inlet pipe 72 is connected to an oxygen gas source 82. A valve V2 and a mass flow controller MF2 as a flow controller are connected midway along the second gas inlet pipe 72. The third gas supply pipe 73 branches into, e.g., four pipes, so it is connected to a nitrogen gas source 83, dinitrogen monoxide gas source 84, hydrogen chloride gas source 85, and oxygen gas source 86. Valves V3, V4, V5, and V6, and mass flow controllers MF3, MF4, MF5, and MF6 are connected to the four branch pipes. The oxygen gas sources 82 and 86 can be one common gas source.

The operation of the heat-treating apparatus shown in FIG. 1 will be described. With this apparatus, a wet oxidation process, dry oxidation process, oxinitriding process, and the like can be selectively performed for, e.g., a wafer as a target substrate with a silicon layer exposed on its surface. In the following description, the operations and effects of the dry oxidation process, a gettering process, the oxinitriding process, the wet oxidation process, and diluted wet oxidation process will be described sequentially.

(Dry Oxidation Process)

When the main controller 57 selects the dry oxidation process, it sends operation signals for the dry oxidation process to the heat-treating unit 11, combustor 12, heating unit 13, and gas distributor 14.

In the heat-treating unit 11, a large number of, e.g., 25 to 150, semiconductor wafers W as the target substrates are held like shelves by the wafer boat 3. The interior of the reaction tube 21 is heated by the heater 22 in advance to a predetermined temperature. The semiconductor wafers W are loaded into the reaction tube 21 by the wafer boat elevator 30. The opening 25 as the furnace opening is hermetically closed by the lid 34 (the state of FIG. 1). Successively, the temperature in the reaction tube 21 is raised to a predetermined temperature, e.g., 800° C., and is stabilized.

In the step of loading the wafers W and the step of raising the temperature in the reaction tube 21, for example, nitrogen gas slightly mixed with oxygen gas is supplied from a gas supply pipe (not shown) into the reaction tube 21. When the interior of the reaction tube 21 reaches the process temperature, gas supply is stopped. The interior of the reaction tube 21 is evacuated by the exhaust means 15 through the exhaust pipe 20. Thus, the interior of the reaction tube 21 is slightly pressure-reduced. In this state, the temperature of the wafers W is stabilized. Then, the oxidation process is performed.

The heating unit 13 is turned on. The power supply amount to the heater 63 and the cooling water supply amount to the cooling jacket 66 are controlled, so the interior of the heating chamber 61 reaches a preset temperature of, e.g., 1,000° C. In the gas distributor 14, the valves V6 and V5 are opened. The oxygen gas and hydrogen chloride gas, respectively adjusted to predetermined flow rates by the mass flow controllers MF6 and MF5, flow into the heating chamber 61 at flow rates of, e.g., 10 slm and 1 slm. At this time, the combustor 12 is turned off, and the valves VA and VB as the primary side of the combustor 12 are closed.

Figure 5A:
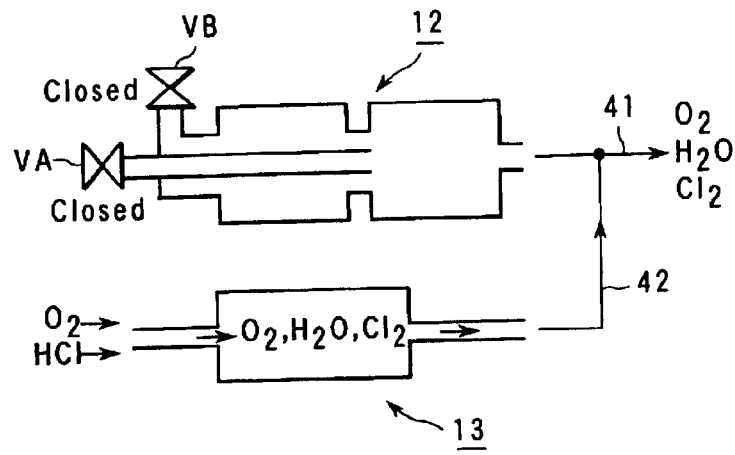
FIGS. 5A to 5C are diagrams showing the gas supply states of the combustor and heating unit for different processes.

As shown in FIG. 5A, the process gases flow in the gaps of the breathing resistance member 62 through a thermally uniformizing tube in the heating chamber 61 while coming into contact with the breathing resistance member 62. While flowing in the heating chamber 61, the process gases are heated to, e.g., near 1,000° C. Hence, the oxygen gas and hydrogen chloride gas react as in the following formulas, so a small amount of water vapor on the order of, e.g., several hundred ppm, may be generated.

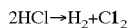

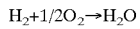

The process gases heated in this manner are supplied to the heat-treating furnace 2 through the second and first gas supply pipes 42 and 41. The process gases shift upward inside the thermally uniformizing tube 23 while being heated, and flow into the upper portion of the reaction tube 21. Furthermore, the process gases are supplied to the process region in the reaction tube 21 through the gas holes 21b, and are exhausted from the lower exhaust pipe 20. During this period of time, the process gases enter among the wafers W held like shelves, to subject the wafers W to a predetermined process. More specifically, the chloride gas removes (gettering) contaminant metals on the wafer surface. The oxygen gas oxidizes the silicon layer on the surface of the wafer W, thus forming a silicon oxide film. These process gases contain a small amount of water vapor, as described above. The oxide film grows because of the water vapor.

During this process, the process gases from the heating unit 13 flow to the combustor 12 through the second and first gas supply pipes 42 and 41. If the valves VA and VB connected to the first and second gas inlet pipes 71 and 72, respectively, of the combustor 12 are closed, the process gases merely enter the combustion chamber 59, and do not flow to the upstream side of the combustion chamber 59.

The silicon oxide film formed by the dry oxidation process according to this embodiment has excellent characteristics in both the planar uniformity and inter-planar uniformity of the thickness. This may be due to the following reason. The process gases (the gas mixture of the oxygen gas and hydrogen chloride gas) are heated by the heating unit 13 to, e.g., near 1,000° C., and activated, so they are thermally decomposed. Thus, small amounts of water vapor and chloride are generated. Even the temperature decreases, the water vapor and chloride once generated in the process gases do not reduce in amount. Assume that water vapor and chloride are generated by the heating unit 13 at a temperature higher than the process temperature in the reaction tube 21. Even if the process gases are cooled while they flow through the second and first gas supply pipes 42 and 41 on the secondary side, changes in the process gases are small. Even when the process gases are heated in the reaction tube 21 after that, they generate no more water vapor.

In other words, the process gases are activated by the heating unit 13 and are thermally decomposed sufficiently. When the process gases enter among the wafers W stacked in the wafer boat 3, they have generated water vapor and chloride almost completely. Therefore, the amounts of water vapor and chloride contained in the process gases flowing from the periphery toward the center of each wafer W are almost the same at any position. As a result, even on the wafer W located at the upper side of the wafer boat 3, the film formation operation by the water vapor and the gettering operation by chloride take place to almost the same degree within the wafer surface. Hence, the planar uniformity of the thickness becomes good.

Furthermore, in the prior art, the lower on the lower side of the wafer boat 3, the more generation of water vapor and chloride progresses. On the upper side, the thickness uniformity is poor. The lower the position of the wafer, the better the thickness uniformity. In contrast to this, with the dry oxidation process according this embodiment, the generation reaction that occurs on the lower side when no heating unit 13 is used has already occurred on the upper side. Hence, variations in thickness distribution among the wafers W decrease, and the inter-planar uniformity of the thickness becomes good.

Strictly, the temperature is higher at the center than at the periphery of the wafer W, so the thickness tends to increase at the center in the first place. When, however, the hydrogen chloride gas and oxygen gas are heated by the heating unit 13 to perform dry oxidation, the film at the peripheral region grows, and consequently the thickness uniformity becomes good. This may be due to the following reason. In the reaction tube 21, the water vapor and chloride obtained in the heating unit 13 flow from the periphery toward the center of the wafer W. Hence, the concentrations of the process gases may slightly decrease toward the center. As a result, film formation and gettering at the periphery progress largely, so the operation of increasing the thickness at the periphery acts.

Since the process gases are heated by using the heating unit 13, they can be activated sufficiently. In the heating unit 13, the heating chamber 61 is formed of quartz, and the heater 63 has a special arrangement. Hence, the heating chamber 61 can be heated to a high temperature of, e.g., 800° C. or more. As described above, the heater 63 has a special structure formed of a string-like body and, e.g., a helical quartz tube. The string-like body is formed by knitting together a plurality of bundles of carbon fibers containing a small amount of metal impurities. The quartz tube accommodates and seals the string-like body.

The breathing resistance member 62 is formed in the heating chamber 61, and the process gases are heated as they come into contact with the breathing resistance member 62. Thus, the temperatures of the process gases increase efficiently. The breathing resistance member 62 is filled in the heating chamber 61. Thus, the process gases flow in the heating chamber 61 while coming into contact with the breathing resistance member 62. This prolongs the stay time of the process gases. The process gases are heated by combination of heating by convection of the process gases themselves heated by the heater 63, and heating by heat transfer from the breathing resistance member 62.

As the breathing resistance member 62, for example, quartz pieces (e.g., beads) each having a diameter of about ϕ1 to ϕ10 are used. As the quartz pieces 62 have a large entire surface area, a large heat transfer area can be reserved, so the process gases can be heated efficiently. The heating chamber 61 and second gas supply pipe 42 are connected to each other. Thus, the process gases sufficiently activated by the heating chamber 61 are supplied to the second gas supply pipe 42 while maintaining a high-temperature state. Since the process gases are supplied to the reaction tube 21 while holding a high active degree, a process with a good planar uniformity and inter-planar uniformity of the thickness can be performed, as described above.

(Gettering Process)

A gettering process is performed for removing the contaminant metals on the wafer surface. When the main controller 57 selects the gettering process, it sends operation signal for the gettering process to the heat-treating unit 11, combustor 12, heating unit 13, and gas distributor 14.

In the heat-treating unit 11, a large number of wafers W are held like shelves by the wafer boat 3. The interior of the reaction tube 21 is heated by the heater 22 in advance to a predetermined temperature. The wafers W are loaded into the reaction tube 21 by the wafer boat elevator 30. The opening 25 as the furnace opening is hermetically closed by the lid 34 (the state of FIG. 1). Successively, the temperature in the reaction tube 21 is raised to a predetermined temperature, e.g., 900° C., and is stabilized.

The heating unit 13 is turned on. The power supply amount to the heater 63 and the cooling water supply amount to the cooling jacket 66 are controlled, so the interior of the heating chamber 61 reaches a preset temperature of, e.g., 1,000° C. In the gas distributor 14, the valves V6 and V5 are opened. Small amounts of oxygen gas and hydrogen chloride gas, respectively adjusted to predetermined flow rates by the mass flow controllers MF6 and MF5, flow into the heating chamber 61 at flow rates of, e.g., 0.01 slm to 1 slm and 0.01 slm to 1 slm. At this time, the combustor 12 is turned off, and the valves VA and VB as the primary side of the combustor 12 are closed.

Figure 5B:
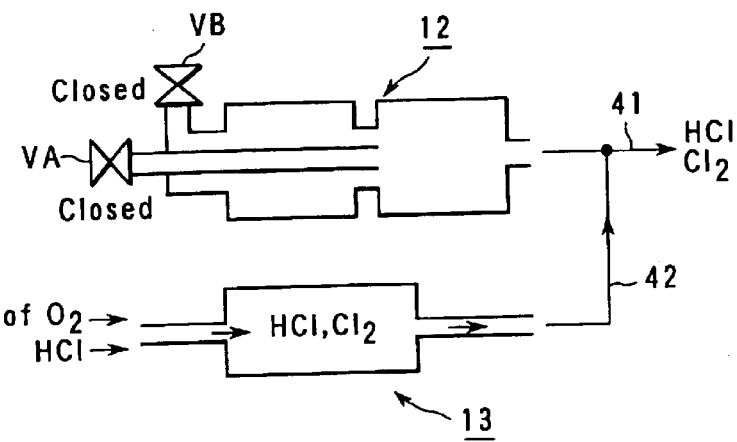

As shown in FIG. 5B, the process gases flow in the gaps of the breathing resistance member 62 through a thermally uniformizing tube in the heating chamber 61 while coming into contact with the breathing resistance member 62. While flowing in the heating chamber 61, the process gases are heated to, e.g., near 1,000° C. Hence, the hydrogen chloride gas and oxygen gas react, so the hydrogen chloride gas and hydrogen gas are present in the mixed state. The process gases heated in this manner are supplied to the heat-treating furnace 2 through the second and first gas supply pipes 42 and 41. In the reaction tube 21, the process gases enter among the wafers W held like shelves, to subject the wafers W to a predetermined process. More specifically, the hydrogen chloride gas and chloride gas remove (gettering) contaminant metals on the wafer surface. The predetermined gettering process is performed in this manner. Successively, e.g., a wet oxidation process is performed.

With the gettering process according to this embodiment, since the hydrogen chloride gas and oxygen gas are sufficiently heated and activated in the heating unit 13, they react sufficiently. Hence, hydrogen chloride, hydrogen, and a small amount of water vapor, which are reaction products, are present in the mixed state. The gettering effect is large, so the efficiency with which the metal on the wafer surface is removed is improved. Accordingly, when a wet oxidation process is to be performed successively, an oxide film is formed on the wafer surface where metals are removed. As a result, a high-quality film can be obtained.

(Oxinitriding Process)

When the main controller 57 selects the oxinitriding process, it sends operation signals for the oxinitriding process to the heat-treating unit 11, combustor 12, heating unit 13, and gas distributor 14.

In the heat-treating unit 11, a large number of wafers W are held like shelves by the wafer boat 3. The interior of the reaction tube 21 is heated by the heater 22 in advance to a predetermined temperature. The wafers W are loaded into the reaction tube 21 by the wafer boat elevator 30. The opening 25 as the furnace opening is hermetically closed by the lid 34 (the state of FIG. 1). Successively, the temperature in the reaction tube 21 is raised to a predetermined temperature, e.g., 800° C., and is stabilized.

The heating unit 13 is turned on. The power supply amount to the heater 63 and the cooling water supply amount to the cooling jacket 66 are controlled, so the interior of the heating chamber 61 reaches a preset temperature of, e.g., 900° C. to 1,000° C. In the gas distributor 14, the valve V4 is opened. Dinitrogen monoxide gas, adjusted to a predetermined flow rate by the mass flow controller MF4, flows into the heating chamber 61 at a flow rate of, e.g., 1 slm to 10 slm. At this time, the combustor 12 is turned off, and the valves VA and VB as the primary side of the combustor 12 are closed.

Figure 5C:
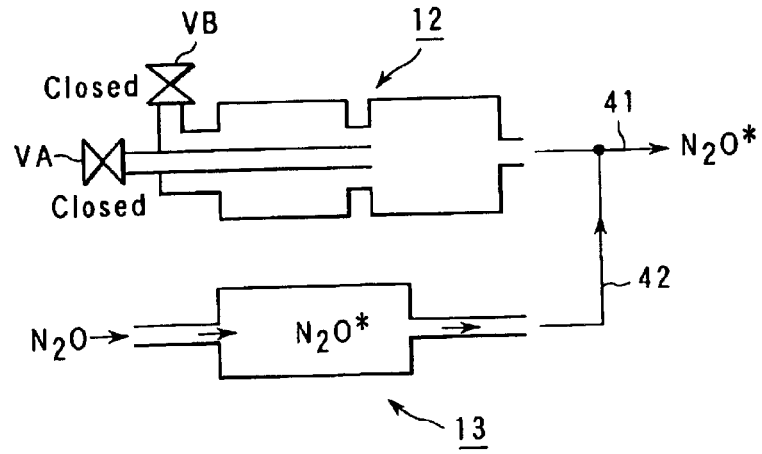

As shown in FIG. 5C, the dinitrogen monoxide gas flows in the gaps of the breathing resistance member 62 through a thermally uniformizing tube in the heating chamber 61 while coming into contact with the breathing resistance member 62. While flowing in the heating chamber 61, the dinitrogen monoxide gas is heated to, e.g., near the preset temperature. Hence, the dinitrogen monoxide gas is pre-heated to a temperature close to the decomposition temperature. The dinitrogen monoxide gas is thus activated to such a degree that it is decomposed as soon as it flows into the reaction tube 21. In FIG. 5C, $N_2O^*$ shows $N_2O$ in the activated state. The dinitrogen monoxide gas heated in this manner enters the reaction tube 21 to oxidize and nitride the silicon layer of the wafer W. Hence, a nitrogen-mixed silicon oxide-film is formed.

With the oxinitriding process according to this embodiment, the formed nitrogen-containing silicon oxide film has excellent characteristics in both the planar uniformity and inter-planar uniformity of the thickness. This may be due to the following reason. The dinitrogen monoxide gas is heated by the heating unit 13 to, e.g., near 900° C. to 1,000° C., and is activated in advance to a state immediately before decomposition. When the dinitrogen monoxide gas enters the reaction tube 21 and reaches the upper side of the wafer boat 3, it has already been decomposed to a considerable degree. Even if the temperature in the reaction tube 21 is low, the dinitrogen monoxide gas is activated sufficiently, so the silicon oxide film can be heavily doped with nitrogen.

At this time, when the dinitrogen monoxide gas flows from the periphery toward the center of the wafer W, the decomposition degree does not substantially differ between the periphery and center. The amount of active species generated by the decomposition of dinitrogen monoxide is almost the same or does not differ very much at any position. Hence, the planar uniformity of the thickness becomes good even in a wafer W located at the upper side of the wafer boat 3. With the oxinitriding process according to this embodiment, the generation reaction occurring on the lower side when the heating unit 13 is not used has already occurred on the upper side. Hence, variations in thickness distribution among the wafers W decrease, and the inter-planar uniformity of the thickness becomes good.

In this manner, with the oxinitriding process according to this embodiment, even if the temperature of the reaction tube 21 is low, the film can be heavily doped with nitrogen. Also, the planar uniformity and inter-planar uniformity of the thickness can be improved.

(Wet Oxidation Process)

When the main controller 57 selects the wet oxidation process, it sends operation signals for the wet oxidation process to the heat-treating unit 11, combustor 12, heating unit 13, and gas distributor 14.

In the heat-treating unit 11, a large number of wafers W are held like shelves by the wafer boat 3. The interior of the reaction tube 21 is heated by the heater 22 in advance to a predetermined temperature. The wafers W are loaded into the reaction tube 21 by the wafer boat elevator 30. The opening 25 as the furnace opening is hermetically closed by the lid 34 (the state of FIG. 1). Successively, the temperature in the reaction tube 21 is raised to a predetermined temperature, e.g., 900° C., and is stabilized.

The combustor 12 is turned on. The power supply amount to the heater 53 is controlled, so the interiors of the heating spaces 52A and 52B reach preset temperatures of, e.g., 900° C. to 950° C. In the gas distributor 14, the valves V1 and V2 are opened. Hydrogen gas and oxygen gas, adjusted to predetermined flow rates by the mass flow controllers MF1 and MF2, flow into the combustor 12 at flow rates of, e.g., 3 slm to 10 slm and 3 slm to 10 slm. The heating unit 13 is turned off. Accordingly, power supply to the heater 63 and cooling water supply to the cooling jacket 66 are not performed. In the gas distributor 14, however, the valve V3 is opened, so nitrogen gas, adjusted to a predetermined flow rate by the mass flow controller MF3, flows into the heating chamber 61 at a flow rate of, e.g., 50 sccm to 500 sccm. In place of the nitrogen gas, oxygen gas may flow into the heating chamber 61.

Figure 6A:
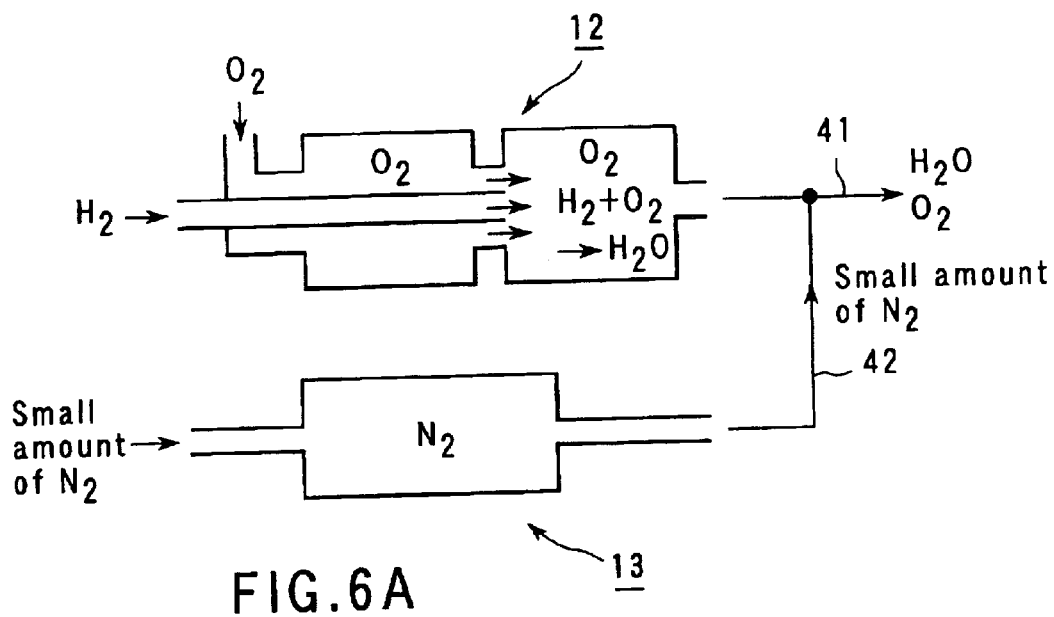
FIGS. 6A and 6B are diagrams showing the gas supply states of the combustor and heating unit for other different processes.

As shown in FIG. 6A, the hydrogen gas and oxygen gas are heated by the inner and outer heating spaces 52A and 52B, respectively, of the combustor 12. Part of the oxygen gas and the hydrogen gas cause combustion reaction in the combustion chamber 59 to generate water vapor. Oxygen gas and water vapor generated in this manner are supplied to the heat-treating furnace 2 through the first gas supply pipe 41. A small amount of nitrogen gas that has passed through the heating unit 13 is also supplied to the heat-treating furnace 2 through the second and first gas supply pipes 42 and 41. In the reaction tube 21, a process gas as the mixture of these gases enters among the wafers W held like shelves, to subject the wafers W to a predetermined process. More specifically, the oxygen gas and water vapor oxidize the silicon layer on the wafer surface, thus forming a silicon oxide film.

With the wet oxidation process according to this embodiment, the combustion reaction of part of the oxygen gas and the hydrogen gas occurs sufficiently in the combustor 12, so they are supplied to the reaction tube 21 after it has already generated water vapor almost completely. Hence, the amounts of water vapor and oxygen contained in the process gas flowing from the periphery toward the center of the wafer W are almost the same at any position. As the supply degrees of the water vapor and oxygen in the surface of the wafer W are almost the same, even when the process temperature is decreased, the planar uniformity of the thickness becomes good.

At this time, since the nitrogen gas is supplied to the heating unit 13, the flow of the gas from the combustor 12 to the heating unit 13 can be prevented. More specifically, the second gas supply pipe 42 is formed of quartz. When the heating unit 13 heats the process gas, the second gas supply pipe 42 reaches a considerably high temperature. Hence, no valves for supplying gases and stopping gas supply can be connected to the second gas supply pipe 42. If the, gases are not supplied from the heating unit 13, the water vapor generated in the combustor 12 undesirably enters-the heating chamber 61 through the second gas supply pipe 42. Once the water vapor is adsorbed by the breathing resistance member 62 filled in the heating chamber 61, it cannot be removed easily. Assume that in this state, the dry oxidation process is to be performed in the following step. Then, the water vapor amount supplied to the reaction tube 21 changes, and the process repeatability degrades. Consequently, the planar uniformity of the thickness decreases. In view of this, to prevent flowing of the gas from the combustor 12 to the heating unit 13 is effective.

(Diluted Wet Oxidation Process)

A diluted wet oxidation process is the following process. A process gas containing oxygen and water vapor used in the wet oxidation process described above is diluted with a small amount of nitrogen gas. Then, the diluted process gas is supplied into the reaction tube 21. When the main controller 57 selects the diluted wet oxidation process, it sends operation signals for the diluted wet oxidation process to the heat-treating unit 11, combustor 12, heating unit 13, and gas distributor 14.

In the heat-treating unit 11, a large number of wafers W are held like shelves by the wafer boat 3. The interior of the reaction tube 21 is heated by the heater 22 in advance to a predetermined temperature. The wafers W are loaded into the reaction tube 21 by the wafer boat elevator 30. The opening 25 as the furnace opening is hermetically closed by the lid 34 (the state of FIG. 1). Successively, the temperature in the reaction tube 21 is raised to a predetermined temperature, e.g., 850° C., and is stabilized.

The combustor 12 is turned on. The power supply amount to the heater 53 is controlled, so the interiors of the heating spaces 52A and 52B reach preset temperatures of, e.g., 900° C. to 950° C. In the gas distributor 14, the valves V1 and V2 are opened. Hydrogen gas and oxygen gas, adjusted to predetermined flow rates by the mass flow controllers MF1 and MF2, flow into the combustor 12 at flow rates of, e.g., 3 slm and 3 slm, respectively. The heating unit 13 is also turned on. The power supply amount to the heater 63 and the cooling water supply amount to the cooling jacket 66 are controlled so the interior of the heating chamber 61 reaches a preset temperature of, e.g., 1,000° C. In the gas distributor 14, the valve V3 is opened, so nitrogen gas, adjusted to a predetermined flow rate by the mass flow controller MF3, flows into the heating chamber 61 at a flow rate of, e.g., 15 slm.

Figure 6B:
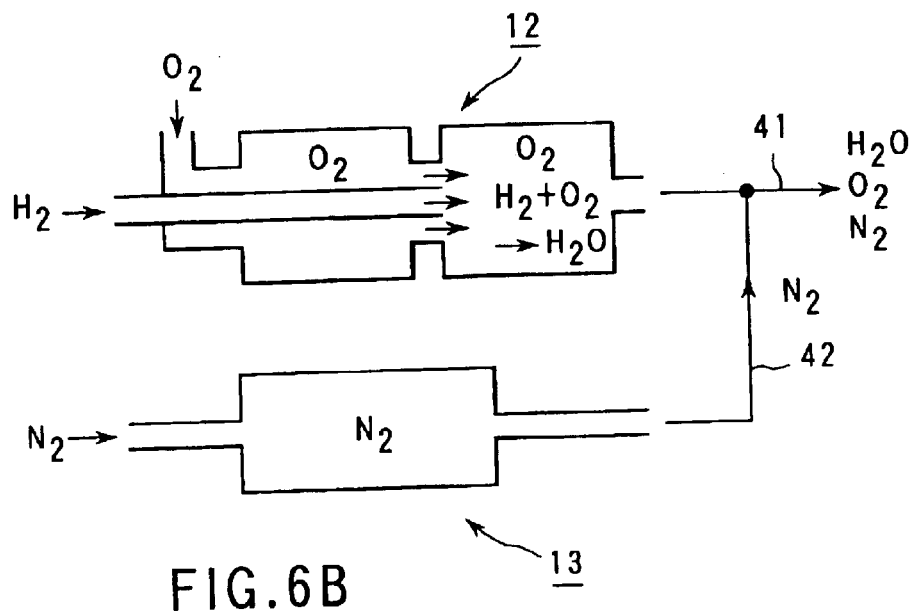

As shown in FIG. 6B, the nitrogen gas flows in the gaps of the breathing resistance member 62 through a thermally uniformizing tube in the heating chamber 61 while coming into contact with the breathing resistance member 62. As the nitrogen gas flows in the heating chamber 61, it is heated to, e.g., near 1,000° C. The nitrogen gas pre-heated in this manner is supplied to the first gas supply pipe 41 through the second gas supply pipe 42. The nitrogen gas is then mixed with the process gas containing the oxygen gas and water vapor which flows from the combustor 12. Hence, the process gas is supplied to the heat-treating furnace 2 as it is diluted by the nitrogen gas. In the reaction tube 21, the process gas as a gas mixture of these gases enters among the wafers W held like shelves, and subjects the wafers W to a predetermined manner. More specifically, the oxygen gas and water vapor oxidize the silicon layer on the wafer surface to form a silicon oxide film.

With the diluted wet oxidation process according to this embodiment, the nitrogen gas is mixed with the process gas containing the oxygen gas and water vapor after it is sufficiently pre-heated by the heating unit 13. Therefore, the temperature of the process gas 10 does not decrease due to mixture with the nitrogen gas. Consequently, a process with a good planar uniformity of the thickness can be performed.

In other words, when the nitrogen gas which is not heated is mixed with the process gas as in the conventional manner, the temperature of the process gas decreases. When the process gas with a decreased temperature is supplied to the reaction tube 21 to perform a process, the film thickness tends to decrease near the periphery of the wafer W. In contrast to this, in the diluted wet oxidation process according to this embodiment, the nitrogen gas is sufficiently pre-heated by the heating unit 13 in advance. Then, a temperature decrease of the process gas can be suppressed, so a decrease in planar uniformity in thickness can be prevented.

As described above, in the heat-treating apparatus shown in FIG. 1, the combustor 12 and heating unit 13 are disposed in a parallel manner. Therefore, the wet oxidation process utilizing the combustor 12; the dry oxidation process, oxinitriding process, and gettering process utilizing the heating unit 13; and the diluted wet oxidation process utilizing both the combustor 12 and heating unit 13 can be performed selectively. In addition, a good result can be obtained with each process.

When a wet oxidation process apparatus having only the combustor 12 is used, if the combustor 12 heats oxygen gas and hydrogen chloride gas, the wet oxidation process and dry oxidation process can be performed. However, the heated oxygen gas is cooled while it passes through the combustion chamber 59 at the next stage of the combustor 12. Thus, the oxygen gas when being supplied to the heat-treating furnace 2 has a low active degree. Therefore, it is difficult to perform a process with a good planar uniformity of the thickness.

In contrast to this, with the heat-treating apparatus shown in FIG. 1, the oxygen gas heated by the heating unit 13 can be supplied to the heat-treating furnace 2 while maintaining its active degree. Therefore, a high planar uniformity of the thickness can be ensured as described above.

With the heat-treating apparatus shown in FIG. 1, various types of processes can be performed well with one heat-treating apparatus. Thus, the range of choice of the processes becomes wide. This is advantageous in terms of cost and space efficiency. Since the processes described above can be performed with one heat-treating apparatus, a plurality of processes can be continuously performed in the following aspects with the wafers being accommodated in the reaction tube 21.

Assume that the gettering process and wet oxidation process are to be combined. The gettering process is performed first with the wafers W being accommodated in the reaction tube 21. Successively, the wet oxidation process is performed continuously. In this case, the metal on the water surface is removed by the gettering process. In this state, a wet oxide film is formed. Therefore, a film with a high quality can be formed.

Assume that a gate oxide film is to be formed by combining the wet oxidation process and dry oxidation process. These two processes can be performed alternately and continuously. In this case, the wet oxidation process is performed first with the wafers W being accommodated in the reaction tube 21. Then, the interior of the reaction tube 21 is purged with, e.g., nitrogen gas. The dry oxidation process is performed next. The interior of the reaction tube 21 is then purged with, e.g., nitrogen gas. Then, the wet oxidation process is performed again. In this manner, the wet oxidation process and dry oxidation process can be performed alternately. When the wet oxidation process and dry oxidation process are to be combined, they may be performed simultaneously in the same time zone.

Similarly, the wet oxidation process and oxinitriding process, or the wet oxidation process, dry oxidation process, and oxinitriding process can be performed continuously. In the latter case, the wet oxidation process is performed first with the wafers W being accommodated in the reaction tube 21. Then, the interior of the reaction tube 21 is purged with, e.g., nitrogen gas. The dry oxidation process is performed. The interior of the reaction tube 21 is then purged with, e.g., nitrogen gas. Finally, the oxinitriding process is performed.

As the gas to be used in the dry oxidation process or gettering process, in place of the hydrogen chloride gas, other compound gases containing hydrogen and chloride, e.g., dichloroethylene gas ($C_2H_2Cl_2$), can be used. As the breathing resistance member 62 to be provided to the heating unit 13, in place of that of this embodiment, one having the following structure can be used. Namely, a plurality of breathing plates with a large number of breathing holes are arrayed in the breathing direction so as to stand in the way of the flow channel.

The second gas supply pipe 42 can form a double pipe at the downstream portion of the heating chamber 61. In this case, an outer pipe is present between the atmosphere and the inner pipe through which the gas flows. The inner pipe does not come into contact with the atmosphere. Hence, the amount of heat dissipated by the heated process gas as the process gas flows through the inner pipe decreases. The process gas can be introduced to the first gas supply pipe 41 while it is kept activated by heating.

An orifice (a portion where the pipe diameter decreases sharply) may be formed on the second gas supply pipe 42 between the heating unit 13 and reaction tube 21. The orifice causes a pressure loss. Even if a pressure-reducing process is performed in the process chamber, the degree of pressure reduction in the heating chamber 61 becomes small. In this case, in the pressure-reducing process as well, the degree with which convection in the heating chamber 61 is interfered with is small. Also, the partial pressure of the process gas in the heating chamber 61 increases. Therefore, heat conduction due to convection of the process gas in the heating chamber 61 tends to occur more easily than in a case wherein no orifice is formed. Thus, the process gas can be sufficiently heated to a predetermined temperature.

Experiment
(Dry Oxidation Process)

Experiments were performed under the process conditions described in (Dry Oxidation Process) of the embodiment described above. An experiment according to the embodiment of the present invention was performed as follows. A dry oxidation process was performed while heating the process gas with the heating unit 13 (by turning on the heater 63 of the heating unit 13). The process time was 90 minutes. A silicon oxide film with a thickness of 10 nm was formed. As a comparative example, a dry oxidation process was performed under the same process conditions except that the process gas was not heated (by turning off the heater 63 of the heating unit 13).

Figure 7A:
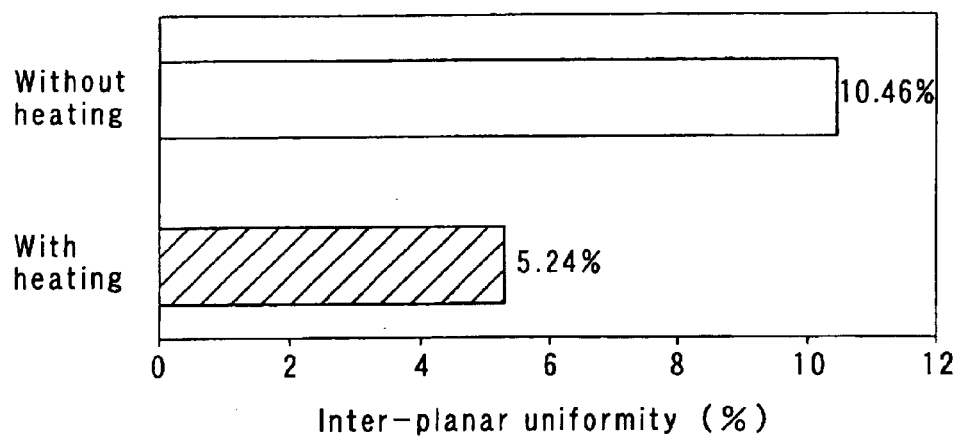
FIGS. 7A and 7B are graphs respectively showing an inter-planar uniformity and planar uniformity as experimental results obtained when a dry oxidation process is performed by using the heat-treating apparatus shown in FIG. 1.
Figure 7B:
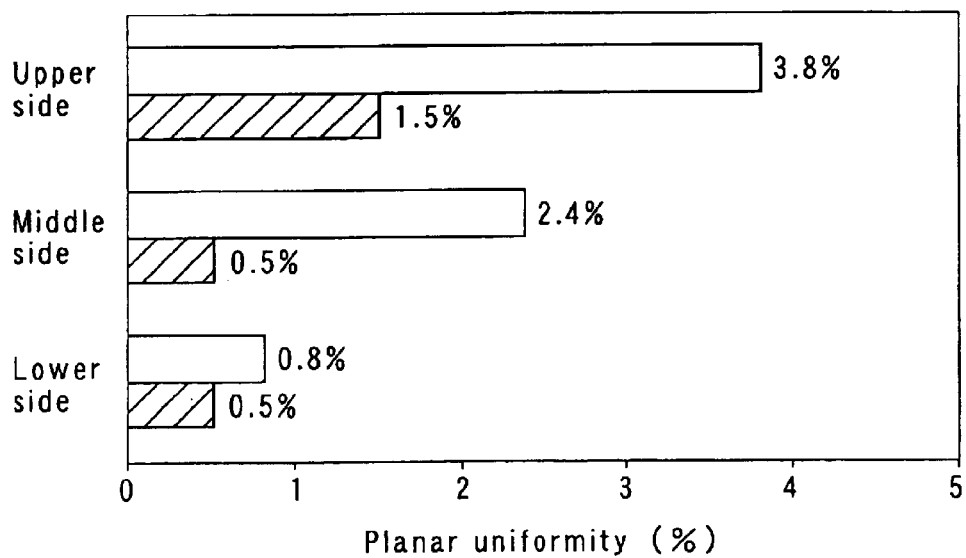

FIGS. 7A and 7B are graphs showing the interplanar uniformity and planar uniformity, respectively, as experimental results obtained when the dry oxidation process is performed by using the heat-treating apparatus shown in FIG. 1. In FIG. 7A, the axis of abscissa represents the average inter-planar uniformity of the thickness, and the axis of ordinate represents whether heating is performed. In FIG. 7B, the axis of abscissa represents the average planar uniformity of the thickness, and the axis of ordinate represents the positions of the wafers W on the wafer boat 3. In FIGS. 7A and 7B, the hatched columns show cases with the process gas being heated, and the non-hatched columns show cases with the process gas being not heated.

The smaller the inter-planar uniformity and planar uniformity of the thickness, the higher the uniformities. As shown in FIG. 7A, when the process gas was heated, the average inter-planar uniformity was smaller than in a case wherein the process gas was not heated. Namely, it was confirmed that when the process gas was heated by the heating unit 13, the inter-planar uniformity was improved. As shown in FIG. 7B, when the process gas was heated, at any position on the upper side, middle side, or lower side of the wafer boat 3, the average planar uniformity was smaller than in the case wherein the process gas was not heated. Namely, it was confirmed that when the process gas was heated by the heating unit 13, the planar uniformity was improved.

(Oxinitriding Process)

Experiments were performed under the process conditions described in (Oxinitriding Process) of the embodiment described above. An experiment according to the embodiment of the present invention was performed as follows. An oxinitriding process was performed while heating the process gas with the heating unit 13 (by turning on the heater 63 of the heating unit 13). The process temperature in the reaction tube 21 was set to 800° C. The process pressure in the reaction tube 21 was set to 93.1 kPa. The temperature of the heating unit 13 was set to 1,000° C. The flow rate of the dinitrogen monoxide gas was set to 5 slm. The process time was 7.5 min. A nitrogen-containing silicon oxide film with a thickness of 2.5 nm was formed. As a comparative example, an oxinitriding process was performed under the same process conditions except that the process gas was not heated (by turning off the heater 63 of the heating unit 13).

Figure 8A:
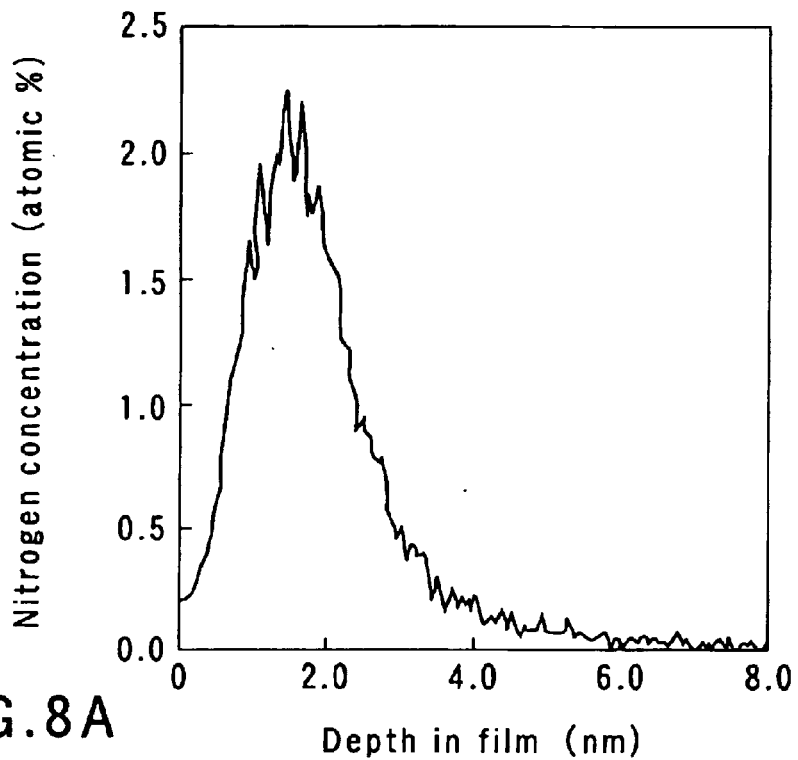
FIGS. 8A and 8B are graphs showing experimental results obtained when an oxinitriding process is performed by using the heat-treating apparatus shown in FIG. 1 and by turning on/off the heating unit.
Figure 8B:
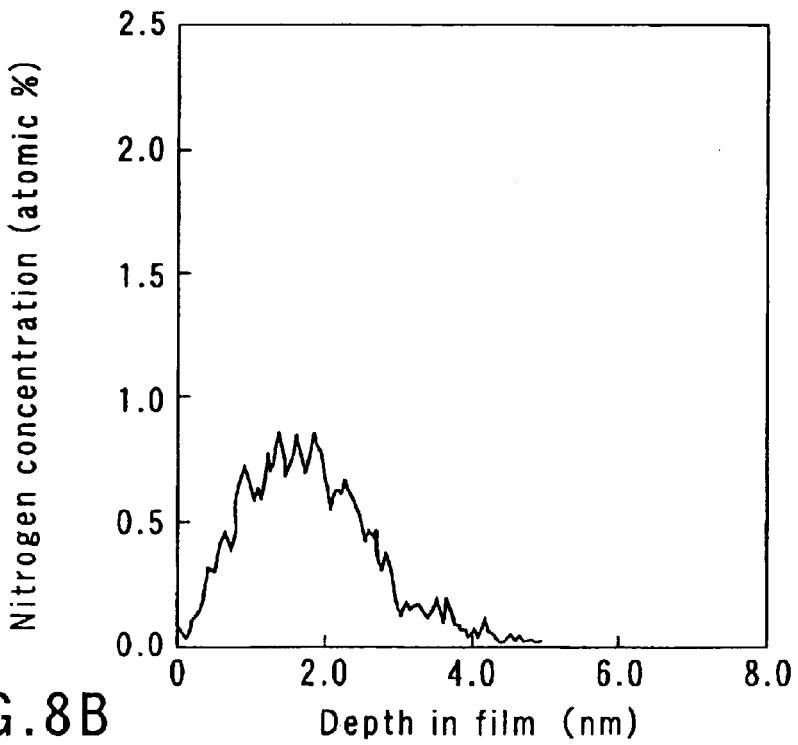

FIGS. 8A and 8B are graphs showing the experimental results obtained when the oxinitriding process is performed by using the heat-treating apparatus shown in FIG. 1 and by turning on/off the heater. In FIGS. 8A and 8B, the axis of abscissa represents depth in the film, and the axis of ordinate represents the nitrogen concentration in the film.

As shown in FIGS. 8A and 8B, when the dinitrogen monoxide gas was heated, the nitrogen concentration in the film was greatly larger than in a case wherein the process gas was not heated. Namely, it was confirmed that when the dinitrogen monoxide gas was heated by the heating unit 13, a silicon oxide film containing a high concentration of nitrogen was formed.

(Diluted Wet Oxidation Process)

Experiments were performed under the process conditions described in (Diluted Wet Oxidation Process) of the embodiment described above. An experiment according to the embodiment of the present invention was performed as follows. A diluted wet oxidation process was performed while heating the nitrogen gas with the heating unit 13 (by turning on the heater 63 of the heating unit 13). The process was performed without rotating the wafer boat 3. A silicon oxide film with a thickness of 6 nm was formed. As a comparative example, a diluted wet oxidation process was performed under the same process conditions except that the nitrogen gas was not heated (by turning off the heater 63 of the heating unit 13).

Figure 9:
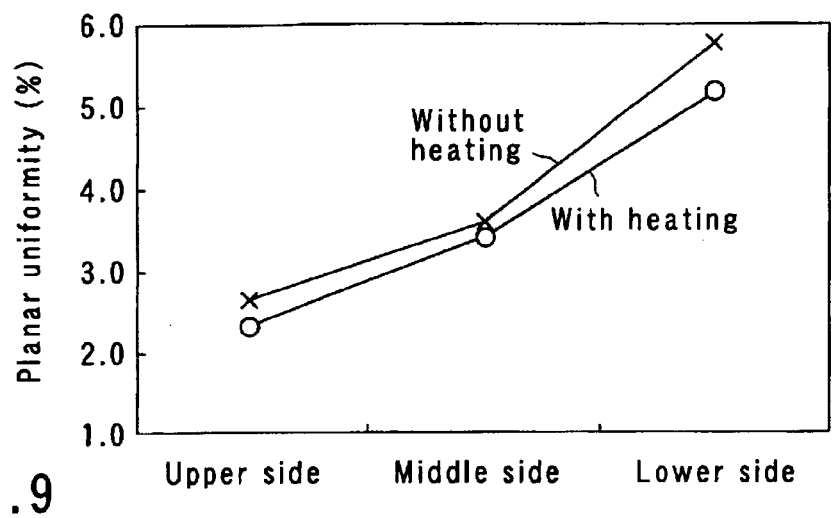
FIG. 9 is a graph showing an experimental result obtained when a diluted wet oxidation process is performed by using the heat-treating apparatus shown in FIG. 1.

FIG. 9 is a graph showing an experimental result obtained when a diluted wet oxidation process was performed by using the heat-treating apparatus shown in FIG. 1. In FIG. 9, the axis of abscissa represents the positions of the wafers W on the wafer boat 3, and the axis of ordinate represents the planar uniformity. In FIG. 9, (o) indicates cases with the nitrogen gas being heated, and (x) indicates cases with the nitrogen gas being not heated.

As shown in FIG. 9, when the nitrogen gas was heated, at any position on the upper side, middle side, or lower side of the wafer boat 3, the average planar uniformity was smaller than in the case wherein the process gas was not heated. Namely, it was confirmed that when the nitrogen gas was heated by the heating unit 13, the planar uniformity of the thickness was improved.

The present invention is not limited to the above embodiments. When practicing the present invention, it can be modified in various manners without departing from its spirit and scope. The embodiments may be practiced in appropriate combinations as much as possible. In this case, a combined effect can be obtained.

What is claimed is:

1. A heat-treating apparatus for a semiconductor process, comprising:

a process chamber which accommodates a target substrate;

a support member which is disposed in the process chamber and supports the target substrate;

a heater which heats the target substrate accommodated in the process chamber;

an exhaust system to evacuate an interior of the process chamber; and a supply system to supply a process gas into the process chamber, wherein the supply system comprises, a combustor which is disposed outside the process chamber and has a combustion chamber, the combustor serving to generate water vapor by reaction of hydrogen gas and oxygen gas in the combustion chamber and supply the water vapor to the process chamber, a heating unit which is disposed outside the process chamber and has a heating chamber and a breathing resistance member disposed in and heated by the heating chamber, the heating unit serving to selectively heat a gas not passing through the combustion chamber to a temperature not lower than an activating temperature of the gas and supply the gas to the process chamber, and a gas distributor which selectively supplies hydrogen gas and oxygen gas to the combustion chamber and selectively supplies a reactive gas and inactive gas to the heating chamber, wherein the heating chamber is made of quartz, and a heating member is disposed to surround the heating chamber, the heating member comprising a heating resistor containing a small mount of metal impurities and an insulating sealing body for scaling the heating resistor.

2. The apparatus according to claim 1, further comprising a controller which controls the combustor, the heating unit, and the gas distributor so as to use the combustor and the heating unit selectively.

3. The apparatus according to claim 1, wherein the gas distributor supplies an inactive gas to the process chamber through the combustion chamber, so as to prevent the water vapor from entering the heating chamber when the water vapor is supplied from the combustor to the process chamber.

4. The apparatus according to claim 1, wherein the heating unit heats gas in the heating chamber to 300° C. to 1,100° C.

5. The apparatus according to claim 1, wherein the breathing resistance member comprises a large number of pieces substantially made of a material selected from the group consisting of quartz and ceramic materials.

6. The apparatus according to claim 1, wherein the gas distributor supplies as the reactive gas, oxidizing gas, oxinitriding gas, and a compound gas containing hydrogen and chloride selectively.

7. The apparatus according to claim 1, wherein the gas distributor supplies nitrogen gas as the inactive gas.

8. The apparatus according to claim 1, wherein the supply system comprises a common inlet pipe connected to the process chamber, the combustion chamber and heating chamber being connected to the common inlet pipe.

9. The apparatus according to claim 1, wherein the heating resistor is made of a string-like body formed by knitting a high-purity carbon material.

10. The apparatus according to claim 1, wherein the sealing body is substantially made of a material selected from the group consisting of quartz and ceramic materials.

11. The apparatus according to claim 1, wherein the support member supports in the process chamber a plurality of target substrates at gaps in a vertical direction.

12. The apparatus according to claim 1, wherein a cooling member is disposed in addition to the heating member around the heating unit, so that temperature of the heating chamber is controlled by an interaction between the heating chamber and the cooling member.

13. The apparatus according to claim 1, wherein an orifice is disposed in a pipe through which gas heated by the heating unit is supplied to the process chamber.

14. The apparatus according to claim 1, wherein a pipe through which gas heated by the heating unit is supplied to the process chamber is formed of a double-pipe, and gas heated by the heating unit flows through an inner pipe of the double-pipe.

15. A heat-treating method for a semiconductor process, comprising the steps of:
   accommodating a target substrate in a process chamber;
   heating the target substrate accommodated in the process chamber,
   performing a wet oxidation process of oxidizing the target substrate to form an oxide film by supplying water vapor to the process chamber while making hydrogen gas react with oxygen gas to generate the water vapor by a combustor which is disposed outside the process chamber and has a combustion chamber, and
   subjecting the target substrate to a first process other than a wet oxidation process by supplying a reactive gas containing an oxidizing gas and a compound gas containing hydrogen and chloride to the process chamber while heating the reactive gas to a temperature not less than an activating temperature of the reactive gas by a heating unit which is disposed outside the process chamber and has a heating chamber,
   wherein the first process is a dry oxidation process of forming an oxide film by oxidizing the target substrate, and
   wherein in the wet oxidation process, an inactive gas is supplied to the process chamber through the heating chamber, so as to prevent water vapor from entering the heating chamber when the water vapor is to be supplied from the combustor to the process chamber.

16. The method according to claim 15, wherein the wet oxidation process and the first process are performed alternately.

17. The method according to claim 15, further comprising a step of performing a diluted wet oxidation process of oxidizing the target substrate to form an oxide film by supplying water vapor to the process chamber while making hydrogen gas react with oxygen gas to generate the water vapor by the combustor, and supplying nitrogen gas to the process chamber while heating the nitrogen gas by the heating unit.

18. A heat-treating apparatus for a semiconductor process, comprising:
   a process chamber which accommodates a target substrate;
   a support member which is disposed in the process chamber and supports the target substrate;
   a heater which heats the target substrate accommodated in the process chamber;
   an exhaust system to evacuate the interior of the process chamber; and
   a supply system to supply a process gas into the process chamber,
   wherein the supply system comprises,
   a combustor which is disposed outside the process chamber and has a combustion chamber, the combustor serving to generate water vapor by reaction of hydrogen gas and oxygen gas in the combustion chamber and to supply the water vapor to the process chamber,
   a heating unit which is disposed outside the process chamber and has a heating chamber, the heating unit serving to selectively heat a gas not passing through the combustion chamber to a temperature not lower than an activating temperature of the gas and supply the gas to the process chamber, and
   a gas distributor which selectively supplies hydrogen gas and oxygen gas to the combustion chamber and selectively supplies a reactive gas and an inactive gas to the heating chamber,
   wherein the heating chamber is made of quartz, and a heating member is disposed to surround the heating chamber, the heating member comprising a heating resistor containing a small amount of metal impurities and an insulating sealing body for sealing the heating resistor,
   wherein the heating resistor is made of a string-like body formed by knitting a high-purity carbon material.

19. The apparatus according to claim 18, wherein the heating unit heats gas in the heating chamber to 300° C. to 1,100° C.

20. The apparatus according to claim 18, wherein the sealing body is substantially made of material selected from the group consisting of quartz and ceramic materials.

21. The apparatus according to claim 18, wherein a cooling member is disposed in addition to the heating member around the heating unit, so that temperature of the heating chamber is controlled by an interaction between the heating chamber and the cooling member.

22. A heat-treating apparatus for a semiconductor process, comprising:
   a process chamber which accommodates a target substrate;
   a support member which is disposed in the process chamber and supports the target substrate;
   a heater which heats the target substrate accommodated in the process chamber;
   an exhaust system to evacuate an interior of the process chamber; and
   a supply system to supply a process gas into the process chamber,
   wherein the supply system comprises,
   a combustor which is disposed outside the process chamber and has a combustion chamber, the combustor serving to generate water vapor by reaction of hydrogen gas and oxygen gas in the combustion chamber and supply the water vapor to the process chamber, a heating unit which is disposed outside the process chamber and has a heating chamber, the heating unit serving to selectively heat a gas not passing through the combustion chamber to a temperature not lower than an activating temperature of the gas and supply the gas to the process chamber, a gas distributor which selectively supplies hydrogen gas and oxygen gas to the combustion chamber and selectively supplies a reactive gas and inactive gas to the heating chamber, and a pipe formed of a double-pipe through which gas heated by the heating unit is supplied to the process chamber through an inner pipe of the double-pipe, wherein the heating chamber is made of quartz, and a heating chamber is disposed to surround the heating chamber, the heating chamber comprising a heating resistor containing a small amount of metal impurities and an insulating sealing body for sealing the heating resistor.

23. The apparatus according to claim 22, wherein an orifice is disposed in the inner pipe through which gas heated by the heating unit is supplied to the process chamber.

24. A heat-treating method for a semiconductor process, comprising the steps of:

accommodating a target substrate in a process chamber;

heating the target substrate accommodated in the process chamber, performing a wet oxidation process of oxidizing the target substrate to form an oxide film by supplying water vapor to the process chamber while making hydrogen gas react with oxygen gas to generate the water vapor by a combustor which is disposed outside the process chamber and has a combustion chamber, and subjecting the target substrate to a first process other than a wet oxidation process by supplying a reactive gas to the process chamber while heating the reactive gas to a temperature not less than an activating temperature of the reactive gas by a heating unit which is disposed outside the process chamber and has a heating chamber, wherein the wet oxidation process and the first process are performed alternately and in the wet oxidation process, an inactive gas is supplied to the process chamber through the heating chamber, so as to prevent water vapor from entering the heating chamber when the water vapor is to be supplied from the combustor to the process chamber.

25. The method according to claim 24, wherein the reactive gas contains an oxidizing gas and a compound gas containing hydrogen and chloride, and the first process is a dry oxidation process of forming an oxide film by oxidizing the target substrate.

26. The method according to claim 24, wherein the reactive gas contains an oxidizing gas and a compound gas containing hydrogen and chloride, and the first process is a gettering process of removing a metal from a surface of the target substrate.

27. The method according to claim 24, wherein the reactive gas contains oxinitriding gas, and the first process is a oxinitriding process of forming a nitrogen-containing oxide film by oxinitriding the target substrate.

28. The method according to claim 24, further comprising a step of performing a diluted wet oxidation process of oxidizing the target substrate to form an oxide film by supplying water vapor to the process chamber while making hydrogen gas react with oxygen gas to generate the water vapor by the combustor, and supplying nitrogen gas to the process chamber while heating the nitrogen gas by the heating unit.

29. A heat-treating method for a semiconductor process, comprising the steps of:

accommodating a target substrate in a process chamber;

heating the target substrate accommodated in the process chamber, performing a wet oxidation process of oxidizing the target substrate to form an oxide film by supplying water vapor to the process chamber while making hydrogen gas react with oxygen gas to generate the water vapor by a combustor which is disposed outside the process chamber and has a combustion chamber, performing a diluted wet oxidation process of oxidizing the target substrate to form an oxide film by supplying water vapor to the process chamber while making hydrogen gas react with oxygen gas to generate the water vapor by the combustor, and supplying nitrogen gas to the process chamber while heating the nitrogen gas by the heating unit, and subjecting the target substrate to a first process other than a wet oxidation process by supplying a reactive gas to the process chamber while heating the reactive gas to a temperature not less than an activating temperature of the reactive gas by a heating unit which is disposed outside the process chamber and has a heating chamber, wherein in the wet oxidation process, an inactive gas is supplied to the process chamber through the heating chamber, so as to prevent water vapor from entering the heating chamber when the water vapor is to be supplied from the combustor to the process chamber.

30. The method according to claim 29, wherein the reactive gas contains an oxidizing gas and a compound containing hydrogen and chloride, and the first process is a dry oxidation process of forming an oxide film by oxidizing the target substrate.

31. The method according to claim 29, wherein the reactive gas contains an oxidizing gas and a compound gas containing hydrogen and chloride, and the first process is a gettering process of removing a metal from a surface of the target substrate.

32. The method according to claim 29, wherein the reactive gas contains oxinitriding gas, and the first process is an oxinitriding process of forming a nitrogen-containing oxide film by oxinitriding the target substrate.

* * * * *